United States Patent
Jeong et al.

(10) Patent No.: US 7,577,016 B2
(45) Date of Patent: Aug. 18, 2009

(54) TWIN-CELL SEMICONDUCTOR MEMORY DEVICES

(75) Inventors: Won-Cheol Jeong, Seoul (KR); Jae-Hyun Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/094,948

(22) Filed: Mar. 31, 2005

(65) Prior Publication Data

US 2006/0023494 A1 Feb. 2, 2006

(30) Foreign Application Priority Data

Jul. 16, 2004 (KR) ............... 10-2004-0055770

(51) Int. Cl.
*G11C 11/00* (2006.01)

(52) U.S. Cl. .................................... 365/158

(58) Field of Classification Search ............... 365/158
See application file for complete search history.

(56) References Cited

U.S. PATENT DOCUMENTS

| | | | | |
|---|---|---|---|---|
| 5,625,234 | A * | 4/1997 | Suzuki et al. ............... | 257/773 |
| 6,034,879 | A * | 3/2000 | Min et al. .................. | 365/63 |
| 6,335,890 | B1 | 1/2002 | Reohr ...................... | 365/225.5 |
| 6,466,471 | B1 | 10/2002 | Bhattacharyya ............. | 365/55 |
| 6,496,436 | B2 | 12/2002 | Naji ........................ | 365/209 |
| 6,721,217 | B2 * | 4/2004 | Madan et al. .............. | 365/203 |
| 6,940,749 | B2 * | 9/2005 | Tsang ...................... | 365/171 |
| 6,943,420 | B2 * | 9/2005 | Jeong ...................... | 257/422 |
| 6,947,324 | B1 * | 9/2005 | Lee et al. ................. | 365/185.05 |
| 2003/0043667 | A1 * | 3/2003 | Somasekhar et al. ........ | 365/207 |
| 2003/0090930 | A1 * | 5/2003 | Rizzo ...................... | 365/158 |
| 2004/0061143 | A1 * | 4/2004 | Koolhaas et al. ........... | 257/204 |
| 2005/0128860 | A1 * | 6/2005 | Hidaka .................... | 365/232 |

FOREIGN PATENT DOCUMENTS

JP 2003-196973 7/2003

* cited by examiner

*Primary Examiner*—Amir Zarabian
*Assistant Examiner*—Anthan T Tran
(74) *Attorney, Agent, or Firm*—Myers Bigel Sibley & Sajovec

(57) ABSTRACT

Twin cell type semiconductor memory devices are provided that include a plurality of main bit lines and a plurality of reference bit lines. Each of the reference bit lines correspond to respective ones of the main bit lines to form a plurality of bit line pairs. A plurality of sense amplifiers are provided that are electrically connected to a respective one of the plurality of bit line pairs. At least one of the plurality of main bit lines or the plurality of reference bit lines is interposed between the main bit line and the corresponding reference bit line of each bit line pair. At least some of the main bit lines may cross respective ones of the reference bit lines in a sense amplifier region of the semiconductor memory device that contains the plurality of sense amplifiers.

8 Claims, 7 Drawing Sheets

TWIN-CELL SEMICONDUCTOR MEMORY DEVICES

CROSS-REFERENCE TO RELATED APPLICATION

This application claims priority under 35 U.S.C. § 119 from Korean Patent Application No. 2004-0055770, filed Jul. 16, 2004, the disclosure of which is hereby incorporated by reference herein as if set forth in its entirety.

FIELD OF THE INVENTION

The present invention relates to semiconductor devices and, more particularly, to semiconductor memory devices.

BACKGROUND OF THE INVENTION

Magnetic random access memory (MRAM) devices are non-volatile memory devices that use a magnetoresistance effect to store information. In MRAM devices, the resistance of an electrical conductor is changed in response to a circumferential magnetic field to store information. The MRAM devices may include a plurality of MRAM cells, each of which may include a magnetic tunnel junction (MTJs), on a single transistor.

The MTJ may include a plurality of thin layers. In particular, electrons may tunnel through a very thin insulating layer that is sandwiched between, for example, two ferromagnetic electrodes in response to the application of an external electrical signal. Conventionally, the top electrode is called a free layer and the bottom electrode is called a pinned layer.

When the direction of the magnetic fields within the free layer and the pinned layer are arranged to be parallel to each other, the tunneling current that flows through the MTJ may tend towards its maximum value, and the tunneling resistance may tend towards its minimum value in this situation. On the other hand, when the direction of the magnetic fields within the free layer and the pinned layer are arranged to be perpendicular to each other, the tunneling current that flows through the MTJ may tend towards its minimum value, and the tunneling resistance will typically tend towards its maximum value in this situation.

Digital data (i.e., "0" and "1" data) may be stored in the MTJ by designating the low resistance state where the magnetization directions of the two electrodes are parallel to each other as one of the binary states and the high resistance state where the magnetization directions of the two electrodes are perpendicular to each other as the other of the binary states. In such devices, there are two cell types that are widely used to read the "0" and "1" states. These cell types are commonly referred to as a reference cell type and a twin cell type.

One method for reading digital data out of an MRAM cell is disclosed in U.S. Pat. No. 6,496,436 B2 to Naji, entitled "Reference Voltage Generator for MRAM and Method." Pursuant to this method, the MRAM device includes MRAM cells that are connected to at least one bit line, and a reference column that is disposed adjacent to the bit line that includes a reference voltage generator. The reference voltage generator includes a plurality of MTJs. Each of the MTJs connected to the reference voltage generator is set to have either a maximum resistance or a minimum resistance. These MTJs are then interconnected to provide an intermediate value of reference resistance between the maximum and minimum values. Both the bit line and the reference column are connected to a sense amplifier. An electrical signal output from one of the MRAM cells connected to the bit line may be compared with an electrical signal output from the reference column that is commonly connected to the sense amplifier. In this fashion, a low resistance state may be discriminated from a high resistance state to determine whether a "0" or "1" is stored in the selected MRAM cell.

A problem, however, may arise when using the above-described reference cell method for reading data from an MRAM cell. The current that is used to read data from the cell flows through a tunneling layer of the MTJ. An insulating layer, such as an aluminum layer, is widely used as the tunneling layer. Thus, the resistance value of the MTJ may be the sum of the resistance value of the tunneling layer and the resistance value that results from the arrangement of the magnetization directions within the free layer and the pinned layer. The resistance value of the tunneling layer, however, may vary with the thickness of the tunneling layer. The thickness of the tunneling layer typically is not constant because of manufacturing variation. Consequently, the resistance of the MTJ will often vary between MTJ cells due to variations in the thickness of the tunneling layer.

The above-described variation in the resistance of MTJ cells may make it difficult to use the reference cell approach for reading data from MRAM devices. The reason for this is that, for proper operation of the device, the change in the magnetoresistance of the MTJ that occurs when the direction of the magnetic fields in the MTJ are switched from parallel to perpendicular to each other is not sufficiently larger than the change in the resistance value of the tunneling layer that can be expected due to expected manufacturing variation using conventional mass production manufacturing techniques.

Because of the above-mentioned problem with the reference cell method of reading data from an MRAM cell, twin cell methods of reading data from MRAM devices have been suggested. In twin cell MRAM devices, one bit of data is written (i.e., stored) in two MTJs by writing the data bit to a first MTJ and writing a complementary data bit to the second MTJ. Both data bits may then be read by comparing the resistance of each MTJ cell to the reference cell. Consequently, in twin cell MRAM devices the amount of magnetoresistance change is doubled and hence is less sensitive to the "noise" that may be introduced by manufacturing variations in the thickness of the tunneling layers.

FIG. 1 is a circuit diagram of a prior art twin cell MRAM device. FIG. 2 is an enlarged view of a portion of the circuit diagram of FIG. 1. As shown in FIG. 1, the twin cell type MRAM device may include a plurality of parallel bit lines B01, B11, B02, B12 which are arranged to form columns, and a plurality of parallel word lines Wi, Wj which are arranged to form rows. In addition, a plurality of digit lines Di, Dj may be provided which cross the bit lines B01, B11, B02, B12. MTJs are provided at the intersections of the bit lines B01, B11, B02, B12 and the digit lines Di and Dj, respectively. Each MTJ is connected to an access transistor TA. As shown in FIG. 1, one end of each MTJ is connected to one of the access transistors TA and the other end of the MTJ is connected to one of the bit lines B01, B11, B02, B12. The gate electrode of each of the access transistors TA is connected to one of the word lines Wi, Wj. Adjacent bit lines B01, B11 are connected to sense amplifier SA1 to form a first bit line pair and bit lines B02, B12 are connected to sense amplifier SA2 to form a second bit line pair.

As noted above, each MTJ is connected to one of the bit lines B01, B11, B02, B12. As shown by the dotted line box labeled "A" in FIG. 1, the MTJs are arranged as pairs of MTJs that are used to store complementary information. For example, when the pair of MTJs "A" is programmed, a digit line program current is applied to the selected digit line Di, and a bit line program current is applied to the pair of bit lines B01 and B11. The bit line program current is applied in a forward direction to one of the pair of MTJs and is applied in a reverse direction to the other of the pair of MTJs. As a result, the data stored in the first of the MTJs is the opposite of the data stored in the second of the MTJs in the pair of MTJs "A".

To read the data stored in the MTJ pair labeled "A", the electrical potentials of the pair of bit lines B01 and B11 are compared by the first sense amplifier SA1 and read as one bit of data.

As shown in FIG. 2, a first magnetic tunnel junction Mi is arranged at the intersection of the first bit line B01 and the digit line Di, and a second magnetic tunnel junction Mj is arranged at the intersection of the second bit line B11 and the digit line Di. When the first magnetic tunnel junction Mi is programmed, a digit line program current is applied to the digit line Di, and a forward bit line program current I0 is applied to the first bit line B01. Simultaneously, a reverse bit line program current I1 is applied to the second bit line B11. The forward bit line program current I0 induces a forward magnetic field F1 to the first bit line B01, and the reverse bit line program current I1 induces a reverse magnetic field F2 to the second bit line B11. Consequently, the first magnetic tunnel junction Mi and the second magnetic tunnel junction Mj are magnetized in opposite directions. For example, if the magnetization directions within the pinned layer and the free layer of the first magnetic tunnel junction Mi are arranged in parallel, the magnetization directions within the pinned layer and the free layer of the second magnetic tunnel junction Mj will be arranged to be perpendicular to each other. If instead, the magnetization directions within the pinned layer and the free layer of the first magnetic tunnel junction Mi are arranged to be perpendicular to each other, the magnetization directions within the pinned layer and the free layer of the second magnetic tunnel junction Mj are arranged parallel to each other.

SUMMARY OF THE INVENTION

Pursuant to embodiments of the present invention, semiconductor memory devices are provided that include a plurality of main bit lines and a plurality of reference bit lines. In these devices, each of the reference bit lines correspond to respective ones of the main bit lines to form a plurality of bit line pairs. A plurality of sense amplifiers are provided that are electrically connected to respective ones of the plurality of bit line pairs. In these devices, at least one of the plurality of main bit lines or the plurality of reference bit lines is interposed between the main bit line and the corresponding reference bit line of each bit line pair. At least some of the main bit lines may cross respective ones of the reference bit lines in a sense amplifier region of the semiconductor memory device.

In certain embodiments of the present invention, the semiconductor memory device may further include a plurality of word lines that cross the main bit lines and the reference bit lines. A plurality of memory cells are arranged at respective intersections of the reference bit lines and the word lines and at the intersections of the main bit lines and the word lines. Each memory cell may be electrically connected to one of the word lines and to one of the main bit lines or the reference bit lines. In these devices, the plurality of memory cells may be, for example, magnetic random access memory (MRAM) cells, ferroelectric random access memory (FeRAM) cells, phase change random access memory (PRAM) cells, or dynamic random access memory (DRAM) cells.

In specific embodiments, a total of two bit lines—which may be two main bit lines, two reference bit lines, or one of each—may be interposed between the main bit line and the corresponding reference bit line of each bit line pair. In other embodiments, a total of three bit lines (any combination) may be interposed between the main bit line and the corresponding reference bit line of each bit line pair. Larger number of bit lines may also be interposed, and the same number of bit lines does not need to be interposed between the bit lines that form each bit line pair.

In embodiments of the present invention that include MRAM memory cells, each of the MRAM cells may include a magnetic tunnel junction (MTJ). The MTJ may include a bottom electrode, a pinning layer pattern, a pinned layer pattern, a tunnel layer pattern, and a free layer pattern which are sequentially stacked.

In certain embodiments of the present invention, the top surfaces and sidewalls of the bit walls may be surrounded by a cladding pattern. The semiconductor memory device may also include a plurality of digit lines that cross the main bit lines and the reference bit lines. These digit lines may have bottom surfaces and sidewalls surrounded by a cladding pattern.

Pursuant to further embodiments of the present invention, semiconductor memory devices are provided which include a plurality of MRAM main cells and a plurality of MRAM reference cells that are grouped in pairs to form a plurality of MRAM cell pairs, each of which are configured to together store a single bit of data. At least one of the plurality of MRAM main cells and/or at least one of the plurality of MRAM reference cells is interposed between the one of the MRAM main cells and the one of the MRAM reference cells that form each MRAM cell pair. In certain embodiments of the present invention, the semiconductor memory device may further include a plurality of parallel bit lines and a plurality of parallel word lines. The plurality of M MRAM main cells and a plurality of MRAM reference cells may be arranged such that each MRAM main cell and each MRAM reference cell is electrically connected to one of the plurality of bit lines and to one of the plurality of word lines. The two MRAM cells that form each MRAM cell pair may be electrically connected to the same word line. The device may further include a plurality of sense amplifiers, and the MRAM cells may be electrically connected to respective ones of the plurality of sense amplifiers such that the two MRAM cells that form each MRAM cell pair are electrically connected to the same sense amplifier.

In still further embodiments of the present invention, semiconductor memory devices are provided which include a plurality of main bit lines and a plurality of reference bit lines. Each of the reference bit lines is associated with a corresponding one of the plurality of main bit lines such that the main bit lines and the reference bit lines are grouped form a plurality of bit line pairs. A plurality of word lines are also provided that cross the main bit lines and the reference bit lines. A plurality of memory cells are electrically connected to respective of the plurality of word lines and to respective of the main bit lines or the reference bit lines. Additionally, the bit lines are arranged such that at least one of the bit lines of each bit line pair crosses over one of the bit lines of another of the bit line pairs.

In specific embodiments, each of the memory cells may be located adjacent the intersection of one of the word lines and either one of the main bit lines or one of the reference bit lines. The device may also include a plurality of sense amplifiers, and the main bit line and the reference bit line of each bit line pair may be electrically connected to a corresponding one of these sense amplifiers. Each memory cell may be an MRAM cell that includes a magnetic tunnel junction and an access transistor that are electrically connected to each other. Moreover, the memory cells may be categorized as main memory cells and reference memory cells, and each main memory cell may correspond to a respective one of the reference memory cells to form a plurality of memory cell pairs, and at least one other memory cell may be interposed between the two memory cells that form each memory cell pair.

In still further embodiments of the present invention, semiconductor memory devices are provided that include a memory cell array region and first, second, third and fourth bit lines, each of which cross over the memory cell array region in a first direction. First and second word lines are provided that cross over the memory cell array region in a second direction that is approximately perpendicular to the first direction. In these devices, the first bit line is adjacent the second bit line in the memory cell array region and is adjacent to the third bit line in a second region of the device whereas the fourth bit line is adjacent the third bit line in the memory cell array region and is adjacent to the second bit line in the second region of the device.

The memory cell array region may include a first memory cell that is located adjacent the intersection of the first bit line and the first word line, a second memory cell that is located adjacent the intersection of the first bit line and the second word line, a third memory cell that is located adjacent the intersection of the second bit line and the first word line, a fourth memory cell that is located adjacent the intersection of the second bit line and the second word line, a fifth memory cell that is located adjacent the intersection of the third bit line and the first word line, a sixth memory cell that is located adjacent the intersection of the third bit line and the second word line, a seventh memory cell that is located adjacent the intersection of the fourth bit line and the first word line, and an eighth memory cell that is located adjacent the intersection of the fourth bit line and the second word line. The device may further include a sense amplifier region that includes a first sense amplifier that is electrically connected to the first, second, fifth and sixth memory cells and second sense amplifier that is electrically connected to the third, fourth, seventh and eighth memory cells. The second region may be the region that includes the first and second sense amplifiers.

In specific embodiments, the second and third bit lines may cross in or near the second region. The first and second bit lines may comprise a first main bit line and a second main bit line, respectively, and the third and fourth bit lines may comprise a first reference bit line and a second reference bit line, respectively. The first memory cell and the fifth memory cell may be configured to together store a first data bit, the second memory cell and the sixth memory cell may be configured to together store a second data bit, the third memory cell and the seventh memory cell may be configured to together store a third data bit, and the fourth memory cell and the eighth memory cell may be configured to together store a fourth data bit.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION OF THE INVENTION

Figure 1:
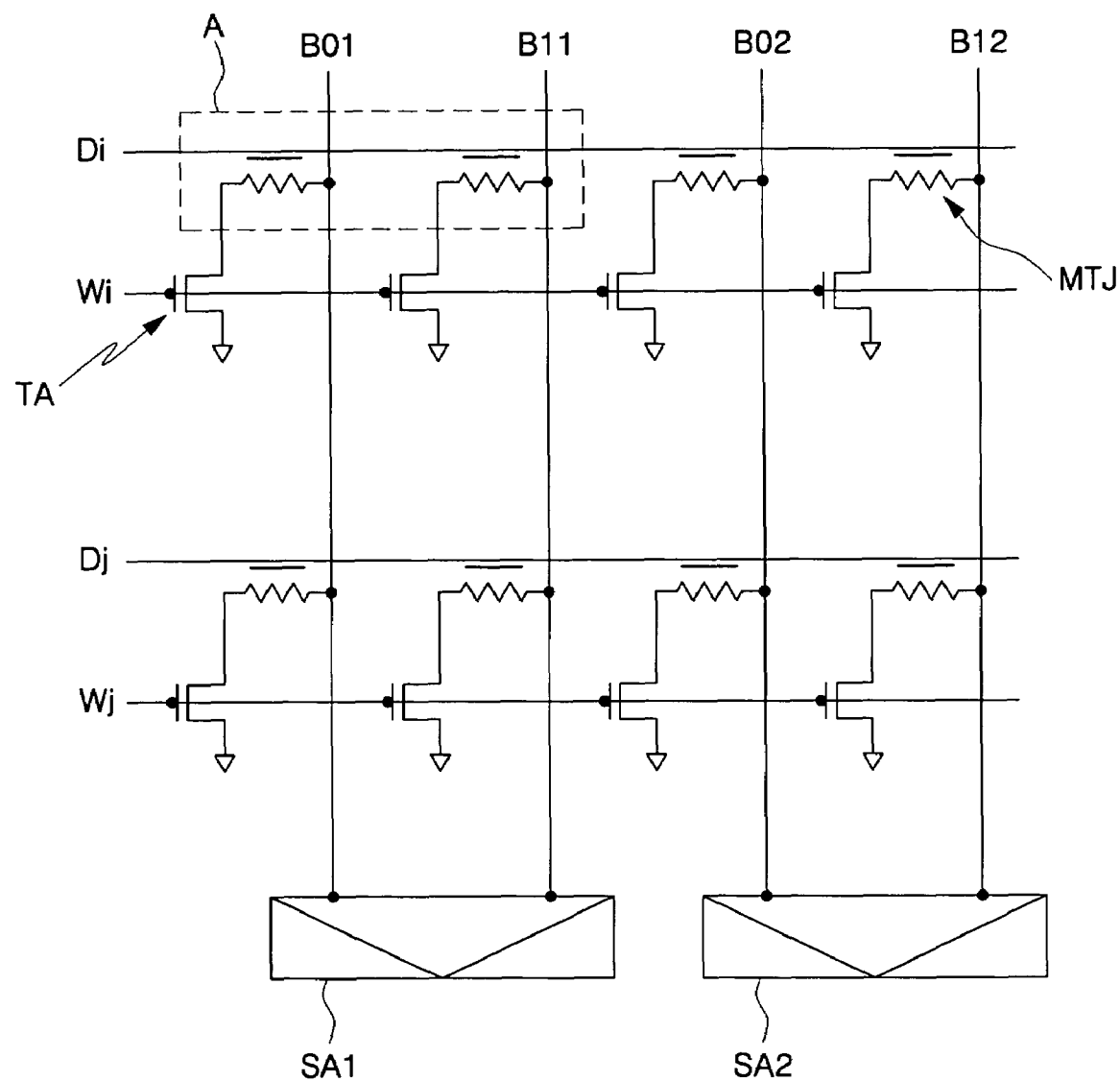
FIG. 1 is a circuit diagram of a conventional prior art twin cell type MRAM device.
Figure 2:
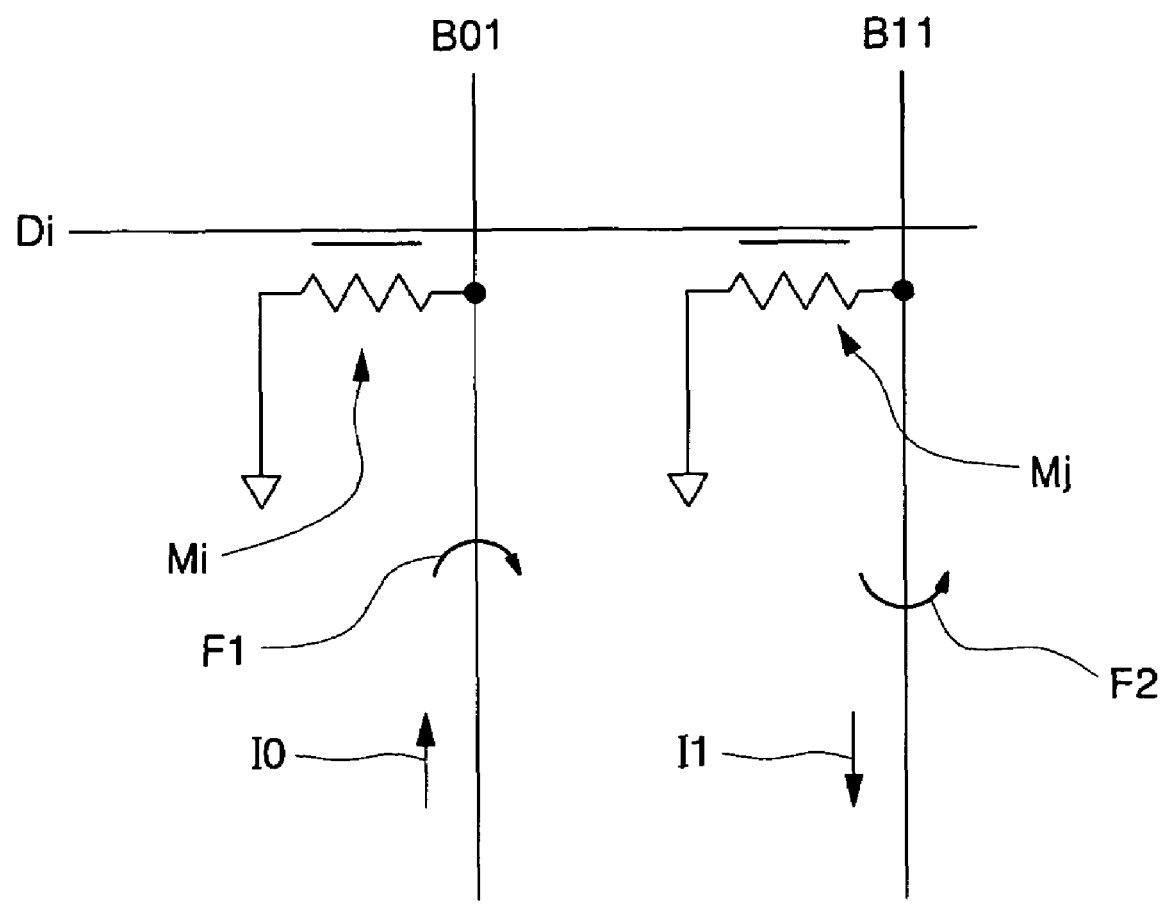
FIG. 2 is a more detailed circuit diagram of a portion of the circuit of FIG. 1.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

It also will be understood that, as used herein, the terms "row" and "column" indicate two non-parallel directions that may be orthogonal to one another. However, the terms row and column do not indicate a particular horizontal or vertical orientation.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
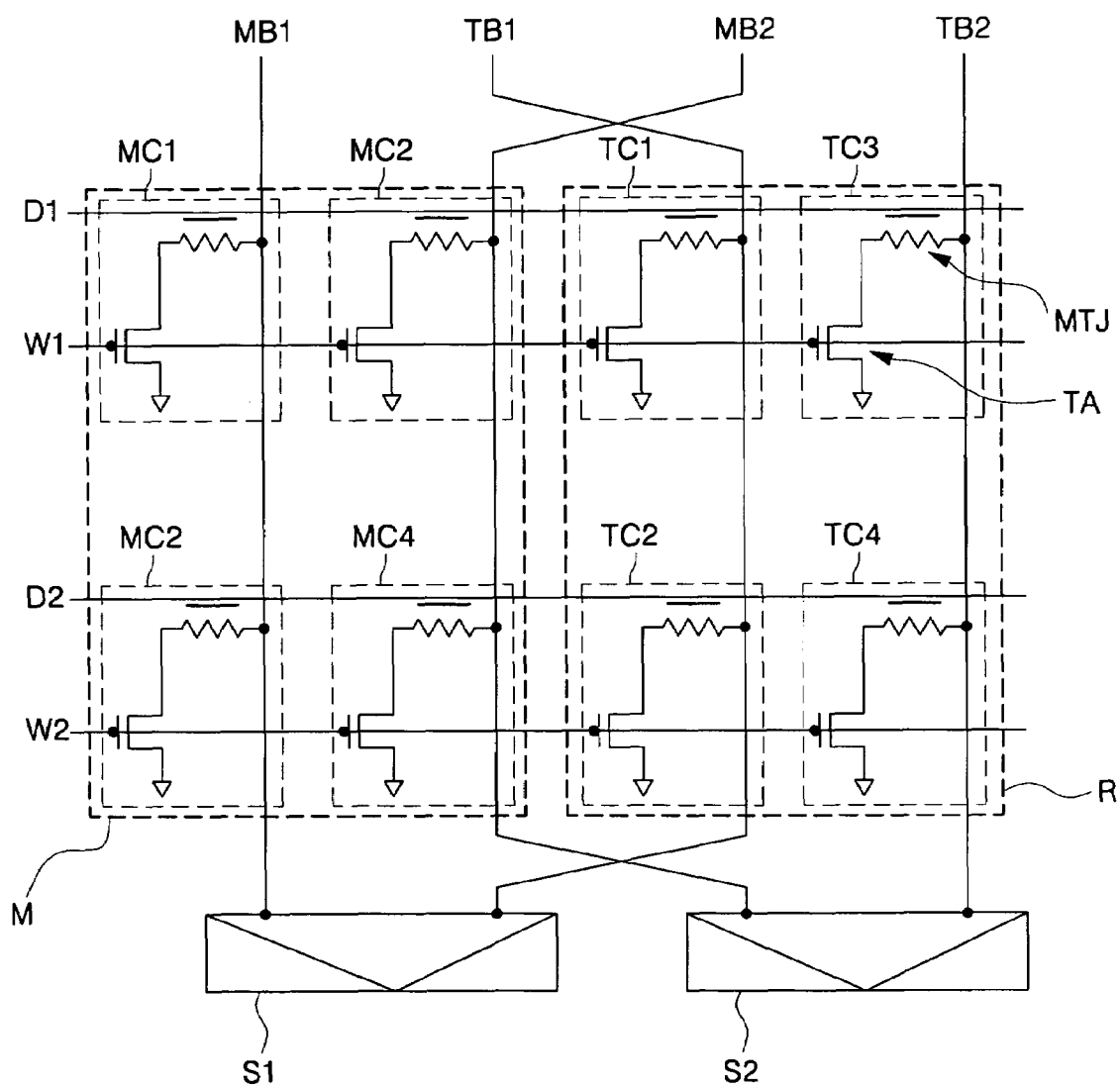
FIG. 3 is a circuit diagram illustrating a semiconductor memory device in accordance with certain embodiments of the present invention.

FIG. 3 is a circuit diagram illustrating a semiconductor memory device in accordance with certain embodiments of the present invention.

As shown in FIG. 3, the memory device includes a main bit line region M and a reference bit line region R. A first main bit line MB1 and a second main bit line MB2 are disposed parallel to each other along columns in the main bit line region M. A first reference bit line TB1 and a second reference bit line TB2 are disposed parallel to each other and parallel to the main bit lines MB1 and MB2 in the reference bit line region R. The first main bit line MB1 and the first reference bit line TB1 form a first bit line pair, and the second main bit line MB2 and the second reference bit line TB2 form a second bit line pair. It will be appreciated that typically far more than two pairs of bit lines (and more than two word lines) will be provided in the MRAM device.

A plurality of sense amplifiers are electrically connected to the main bit lines and the reference bit lines. For example, as shown in FIG. 3, the first main bit line MB1 and the first reference bit line TB1 are connected to a first sense amplifier S1, and the second main bit line MB2 and the second reference bit line TB2 are connected to a second sense amplifier S2.

A plurality of word lines may be provided that cross the main and reference bit lines. For example, in the embodiment of FIG. 3, a first word line W1 and a second word line W2 cross the main bit lines MB1 and MB2 and the reference bit lines TB1 and TB2. First to fourth main cells MC1, MC2, MC3, MC4 are arranged at intersections of the main bit lines MB1 and MB2 and the word lines W1 and W2. Additionally, first to fourth reference cells TC1, TC2, TC3, TC4 are arranged at intersections of the reference bit lines TB1 and TB2 and the word lines W1 and W2.

The first main bit line MB1 and the first reference bit line TB1 operate as one bit line pair, and the second main bit line MB2 and the second reference bit line TB2 operate as another bit line pair. Likewise, the first main cell MC1 and the first reference cell TC1 operate as one memory cell pair that store respective data which are always opposite to each other, and the second main cell MC2 and the second reference cell TC2 operate as another memory cell pair that store respective data which are always opposite to each other. To read the stored data from the first of these memory cell pairs, the electrical potential of the first main bit line MB1 connected to the first main cell MC1 and the electrical potential of the first reference bit line TB1 connected to the first reference cell TC1 are compared by the first sense amplifier S1 such that the two potentials are read as one bit of data.

When the first main bit line MB1 and the first reference bit line TB1 are operated as a pair, an electrical signal is not applied to the second main bit line MB2 disposed between the first main bit line MB1 and the first reference bit line TB1. Thus, interference between the first main bit line MB1 and the first reference bit line TB1 may be reduced. Accordingly, at least one other bit line may be disposed between the first main bit line MB1 and the first reference bit line TB1 as shown in FIG. 3. The at least one other bit line may be the second main bit line MB2 as shown in FIG. 3, or may be the second reference bit line TB2. Alternatively, the at least one other bit line may be composed of a plurality of other bit lines.

The main cells MC1, MC2, MC3, MC4 and the reference cells TC1, TC2, TC3, TC4 may comprise magnetic random access memory (MRAM) cells, ferroelectric random access memory (FeRAM) cells, phase change random access memory (PRAM) cells, or dynamic random access memory (DRAM) cells.

In the description of some embodiments of the present invention below, the main cells MC1, MC2, MC3, MC4 and the reference cells TC1, TC2, TC3, TC4 comprise MRAM cells which each include a MTJ and an access transistor TA connected to a bottom electrode of the MTJ.

Figure 4:
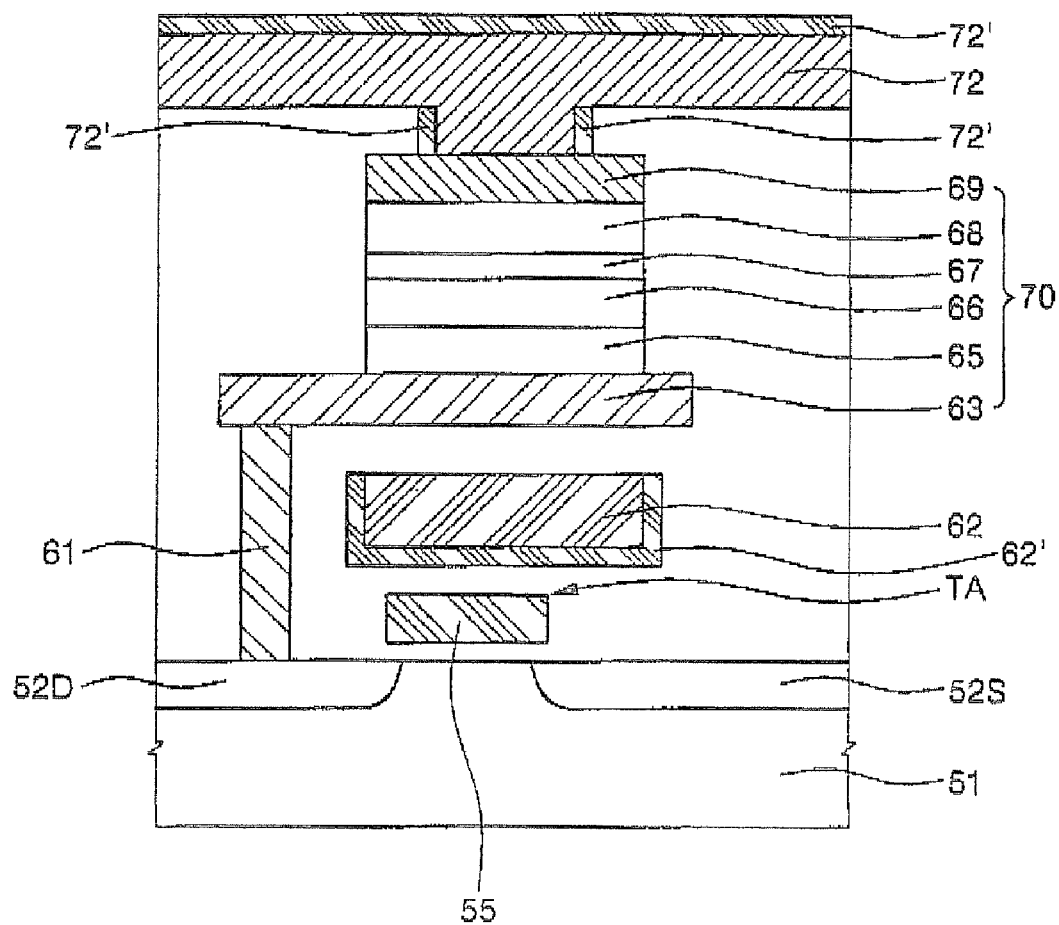
FIG. 4 is a cross-sectional view illustrating a MRAM cell in accordance with certain embodiments of the present invention.

FIG. 4 is a cross-sectional view illustrating a MRAM cell in accordance with certain embodiments of the present invention. As shown in FIG. 4, the MRAM cell includes an access transistor TA on a predetermined region of a semiconductor substrate 51. The access transistor TA includes a source region 52S, a drain region 52D, a channel region between the source and drain regions and a gate electrode 55 disposed above the channel region that may act as a word line. A digit line 62 is disposed above the access transistor TA. The digit line 62 is arranged parallel to the word line.

The bottom surface and sidewalls of the digit line 62 may be surrounded by a cladding pattern 62'. The digit line 62 may be a conductive layer such as a copper layer or an aluminum layer. The cladding pattern 62' may be formed of a ferromagnetic layer such as NiFe. The cladding pattern 62' may focus the magnetic flux generated by the current flowing through the digit line 62.

A MTJ 70 is disposed above the digit line 62 and opposite to the access transistor TA. In the embodiment of FIG. 4, the MTJ 70 is a stacked structure which includes a bottom electrode 63, a pinning layer pattern 65, a pinned layer pattern 66, a tunneling layer pattern 67, a free layer pattern 68, and a top electrode 69 which are sequentially stacked. A layer of insulating material is interposed between the digit line 62 and the bottom electrode 63 which may act to insulate the MTJ 70 from the digit line 62. The bottom electrode 63 may be electrically connected to the drain region 52D through a contact plug 61 or other electrical path, or may be in direct contact with the drain region 52D.

The top electrode 69 is electrically connected to the bit line 72 that crosses the digit line 62. The top surface and sidewalls of the bit line 72 may be surrounded by a cladding pattern 72'. The bit line 72 may be a conductive layer such as a copper layer or an aluminum layer. The cladding pattern 72' may comprise, for example, a ferromagnetic layer such as NiFe. The cladding pattern 72' may act to focus a magnetic flux generated by the current flowing through the bit line 72.

The pinning layer pattern 65 may comprise an anti-ferromagnetic layer, and the pinned layer pattern 66 and the free layer pattern 68 may comprise ferromagnetic layers. The pinning layer pattern 65 may act to fix the magnetization direction of the pinned layer pattern 66. In particular, the pinned layer pattern 66 may have a large switching field, and the magnetization direction of the pinned layer pattern 66 may be fixed in a constant direction when an applied magnetic field is smaller than the switching field. The pinned layer pattern 66 may have a structure composed of one ferromagnetic layer, or a synthetic anti-ferromagnetic (SAF) structure including three layers. The SAF structure may include a bottom pinned layer and a top pinned layer which are separated by an exchange spacer layer. Each of the bottom pinned layer and the top pinned layer may be a ferromagnetic layer. The exchange spacer layer may be a ruthenium (Ru) layer. The SAF structure has a characteristic that the magnetization directions of the bottom and top pinned layers are arranged to be perpendicular to each other due to the effect of the exchange spacer layer. That is, when an initial magnetization direction is applied to the bottom pinned layer, the magnetization direction of the top pinned layer is arranged in a perpendicular state.

When the MRAM cell operates in program mode, the program current flows through the bit line 72 and the digit line 62 to magnetize the free layer pattern 68. The magnetization direction forced within the free layer pattern 68 during the operation in program mode is determined by the direction of the program current flowing through the bit line 72, and will be parallel or perpendicular to the magnetization direction maintained within the pinned layer pattern 66. When magnetized spins within the free layer pattern 68 are arranged parallel to spins fixed within the pinned layer pattern 66, the tunneling layer pattern 67 will show a decreased magnetoresistance value. When, on the other hand, the magnetized spins within the free layer pattern 68 are arranged perpendicular to the spins fixed within the pinned layer pattern 66, the tunneling layer pattern 67 will show an increased magnetoresistance value.

When the MRAM cell operates in a read mode, a sensing voltage is applied to the bit line 72, the source region 52S is grounded, and a read voltage is applied to the word line to turn on the access transistor TA. When the tunneling layer pattern 67 which depends on the magnetization direction of the free layer pattern 68 has a low magnetoresistance value, a relatively large current will flow through the bit line 72. When, on the other hand, the tunneling layer pattern 67 which depends on the magnetization direction of the free layer pattern 68 has a high magnetoresistance value, a relatively small current will flow through the bit line 72. Consequently, by means of the sensing voltage, the magnetization direction of the free layer pattern 68 may be identified from the value of the current which flows through the bit line 72.

Descriptions will be made on program and read operations of the semiconductor memory device with reference to FIGS. 3 and 4.

When main cells MC1, MC2, MC3, MC4 and reference cells TC1, TC2, TC3, TC4 comprise MRAM cells, a first digit line D1 and a second digit line D2 are disposed in a direction crossing the bit lines MB1, MB2, TB1, TB2. The MRAM cells are arranged at intersections of the bit lines MB1, MB2, TB1, TB2 and the digit lines D1 and D2, respectively. As described above, each MRAM cell includes an MTJ and an access transistor TA. The top electrode 69 of each MTJ is connected to one of the bit lines MB1, MB2, TB1, TB2, and gate electrodes of the access transistors TA are connected to one of the word lines W1, W2.

The first main cell MC1 and the first reference cell TC1 operate as one memory cell pair and the second main cell MC2 and the second reference cell TC2 operate as a second memory cell pair. For example, when complementary information is programmed in the pair comprising first main cell MC1 and first reference cell TC1, a digit line program current is applied to the first digit line D1 and a bit line program current is applied to the first main bit line MB1 while another bit line program current flowing in a direction opposite to the bit line program current is concurrently applied to the first reference bit line TB1 and the first sense amplifier S1 is turned off. Magnetic fields are induced to the first main bit line MB1 and the first reference bit line TB1 in directions opposite to each other, so that the free layer patterns built in the first main cell MC1 and the first reference cell TC1 are magnetized in directions opposite to each other. No current is applied to the second main bit line MB2 that is disposed between the first main bit line MB1 and the first reference bit line TB1 in the exemplary embodiment of FIG. 3, in order to reduce or prevent interference between the first main bit line MB1 and the first reference bit line TB1.

In order to read the stored data, a read voltage is applied to the first word line W1, and a sensing voltage is applied to the first main bit line MB1 and the first reference bit line TB1. The current flowing through the first main bit line MB1 and the current flowing through the first reference bit line TB1 are compared by the sense amplifier S1 such that the two currents are read as one bit of data.

Figure 5:
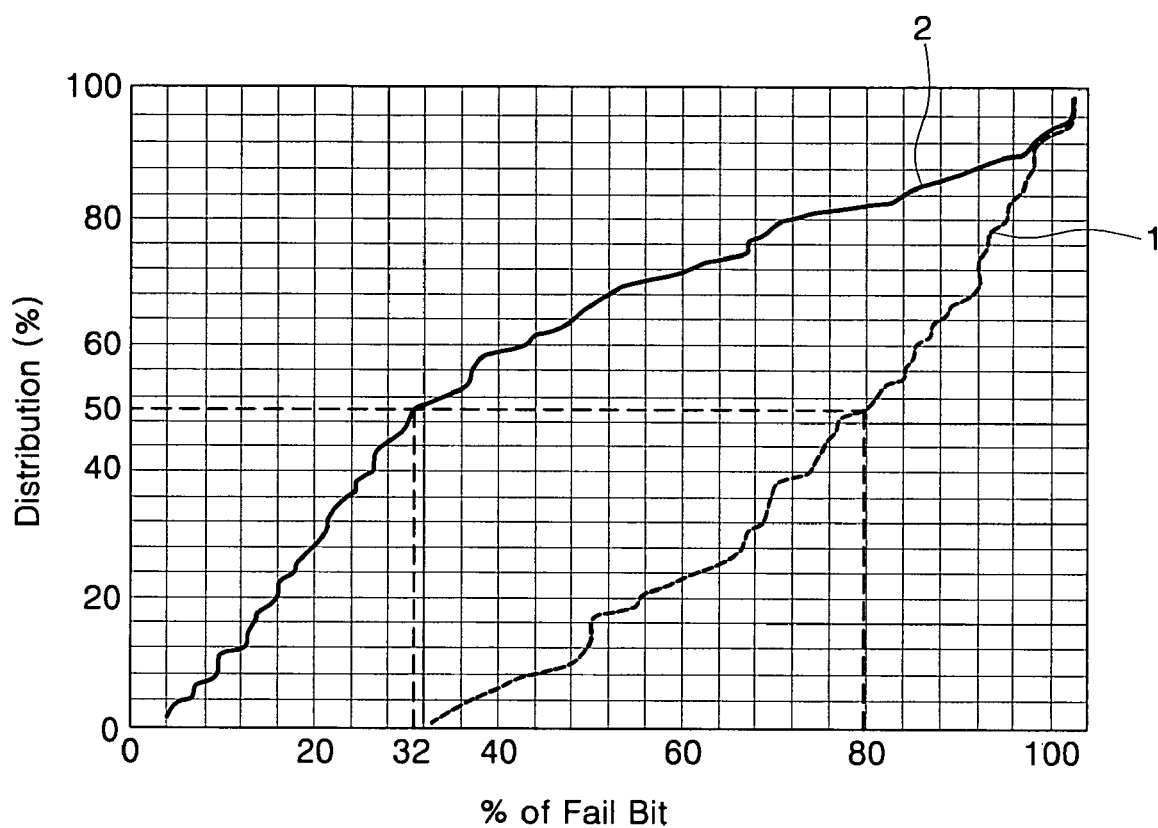
FIG. 5 is a distribution chart of bit failures of a semiconductor memory device fabricated in accordance with embodiments of the present invention.

FIG. 5 is a distribution chart of bit failures that occurred during a series of program and read tests. In FIG. 5, curve 1 charts the bit failures for a prior art semiconductor memory device in which the main bit line and the reference bit line are disposed adjacent to each other, whereas, curve 2 charts the bit failures for a semiconductor memory device according to embodiments of the present invention in which another bit line is disposed between the main bit line and the reference bit line.

The semiconductor devices that were used in the tests of FIG. 5 used MRAM cells that used a cobalt iron boron (CoFeB) layer as the free layer pattern. In these devices, the bit lines were fabricated to have a width of 1 um and the distance between adjacent bit lines was 0.2 um.

In FIG. 5, the horizontal axis of the chart indicates the bit failure rate (as a percentage), which means the rate of the failed bits resulted from the read results of data programmed within the semiconductor memory chips. The longitudinal axis indicates a chip cumulative frequency rate (as a percentage), which is the cumulative frequency rate of the semiconductor memory chips used for the test.

As shown in FIG. 5, the bit failure rate of the semiconductor memory device fabricated in accordance with an embodiment of the present invention (curve 2) is relatively low. For example, with the prior art semiconductor memory device, the bit failure rate at the point of 50% of the chip cumulative frequency rate is 80% (see curve 1). In other words, 50% of the chips fabricated in accordance with the prior art are analyzed to have failed bits of at least 80%. In contrast, the bit failure rate at the point of 50% of the chip cumulative frequency rate is 32% (see curve 2) when a device in accordance with an embodiment of the present invention is used. That is, 50% of the chips fabricated in accordance with an exemplary embodiment of the present invention were found to have failed bits of 32% or less. Consequently, semiconductor memory devices fabricated in accordance with the embodiments of the present invention which have a structure where at least one bit line is disposed between the main bit line and the reference bit line may exhibit improved performance characteristics.

Figure 6:
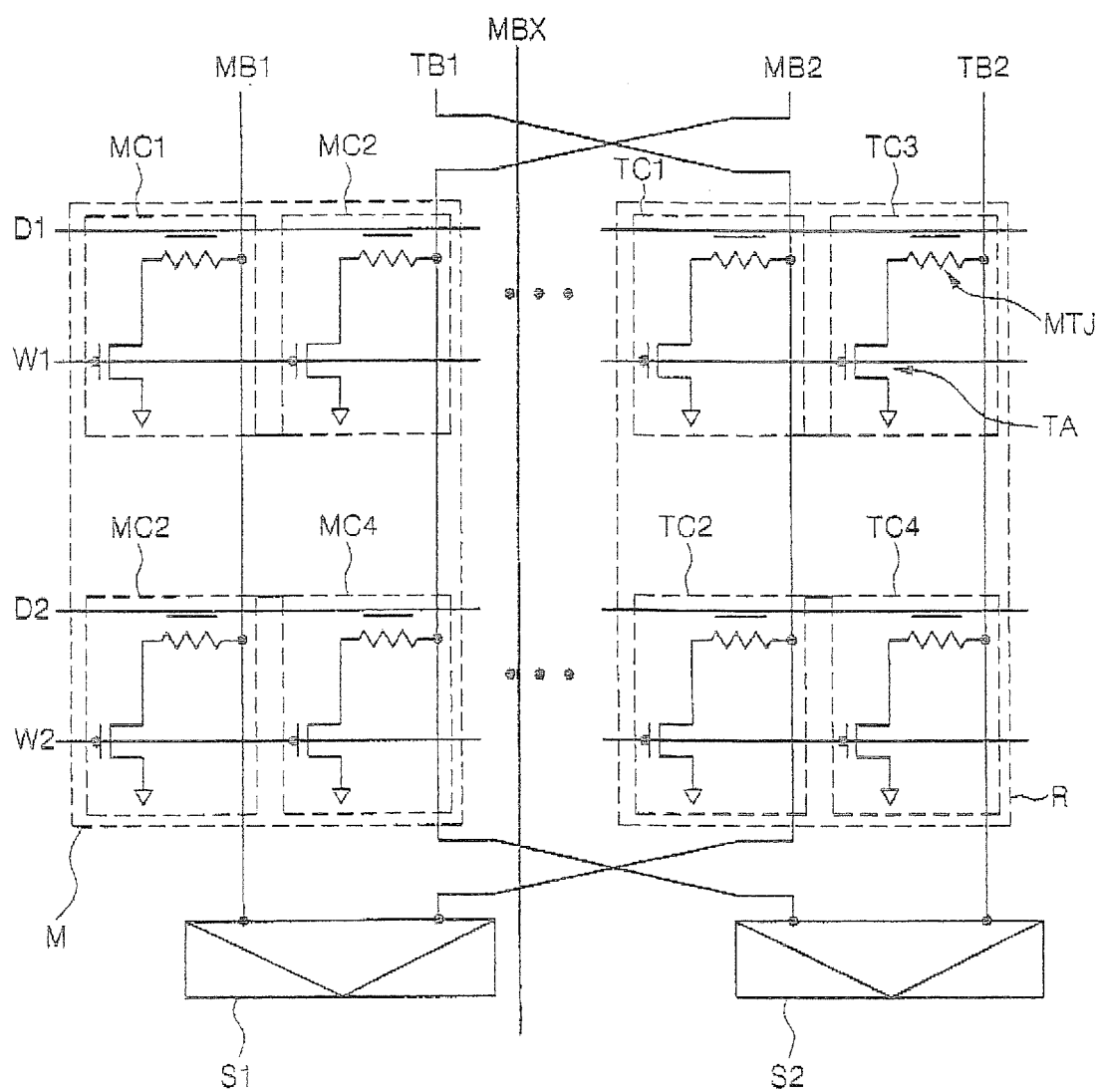
FIG. 6 is a circuit diagram illustrating a semiconductor memory device in accordance with further embodiments of the present invention.
Figure 7:
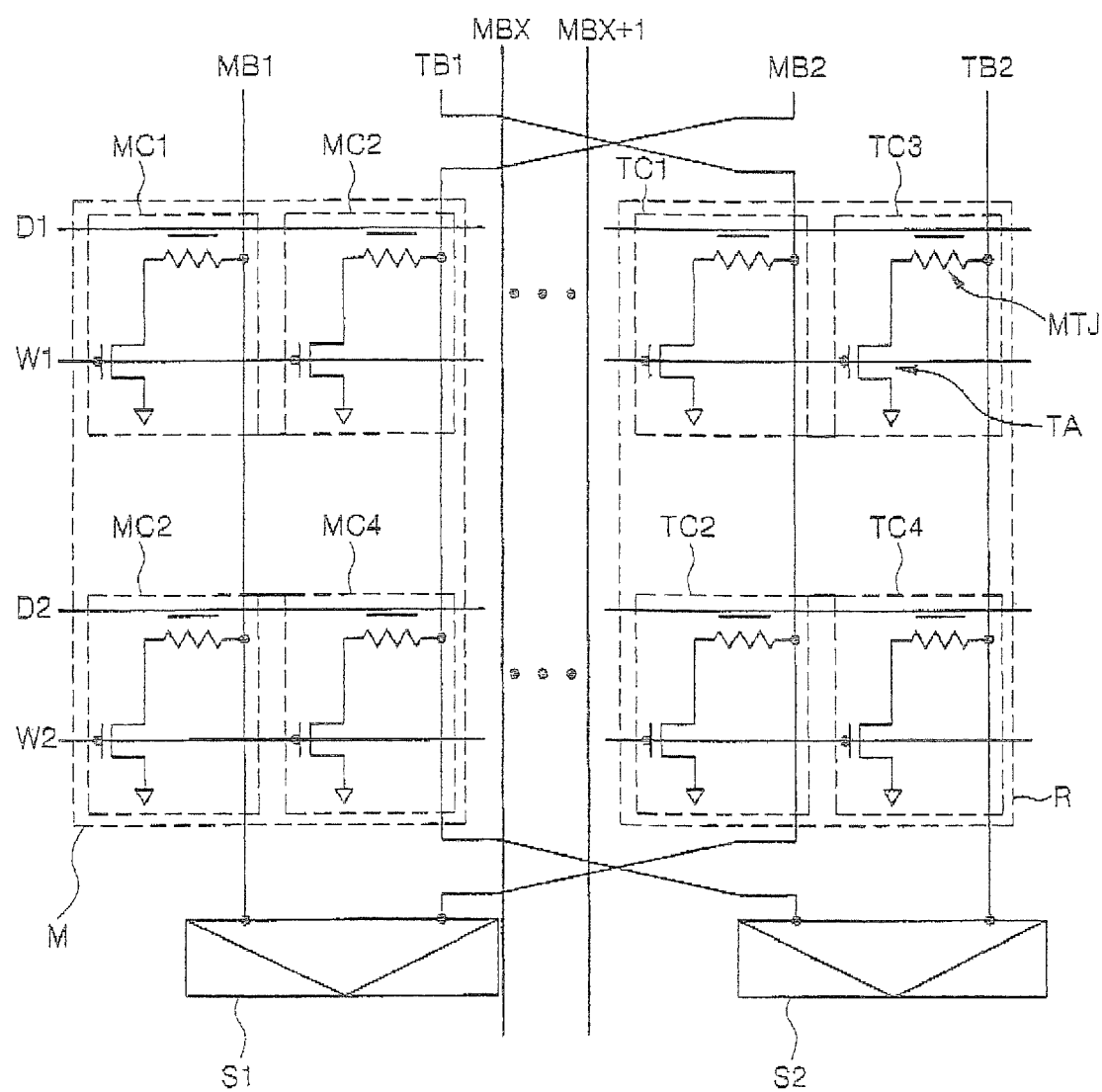
FIG. 7 is a circuit diagram illustrating a semiconductor memory device in accordance with still further embodiments of the present invention.

In specific embodiments, such as the embodiment depicted in FIG. 6, a total of two bit lines—which may be two main bit lines, two reference bit lines, or one of each—may be interposed between the main bit line and the corresponding reference bit line of each bit line pair. In other embodiments such as the embodiment depicted in FIG. 7, a total of three bit lines (any combination) may be interposed between the main bit line and the corresponding reference bit line of each bit line pair. Larger number of bit lines may also be interposed, and the same number of bit lines does not need to be interposed between the bit lines that form each bit line pair.

According to embodiments of the present invention, one or more additional bit lines may be disposed between a main bit line and a reference bit line which operate as a bit line pair. During operation of the main bit line and the reference bit line, electrical signals are not applied to the one or more other bit lines that are disposed between the main bit line and the reference bit line. Accordingly, interference between the main bit line and the reference bit line may be reduced or prevented. Consequently, the distance between bit lines may be decreased, thereby allowing increased rates of device integration.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor memory device, comprising:
   a plurality of main bit lines;
   a plurality of reference bit lines, wherein each of the reference bit lines correspond to respective ones of the main bit lines to form a plurality of bit line pairs;
   a plurality of word lines that cross the main bit lines and the reference bit lines to define a plurality of crossing points;
   a plurality of magnetic random access memory (MRAM) memory cells, where one of the plurality of MRAM memory cells is located at each respective crossing point; and
   a plurality of sense amplifiers, each of which are electrically connected to a respective one of the plurality of bit line pairs;
   wherein each MRAM memory cell is electrically connected to one of the plurality of word lines and to one of the plurality of main bit lines or the plurality of reference bit lines;
   wherein at least one of the plurality of main bit lines and/or at least one of the plurality of reference bit lines is interposed between the main bit line and the corresponding reference bit line of each bit line pair;
   wherein at least a subset of the main bit lines cross respective ones of the reference bit lines two times to define two crossovers for each of the subset of the main bit lines, and wherein all of the plurality of MRAM memory cells that are connected to respective ones of the subset of the main bit lines are connected to their respective main bit line between the respective two crossovers;
   wherein the bit lines have top surfaces and sidewalls surrounded by a cladding pattern; and, wherein a respective one of the plurality of MRAM memory cells is located at every intersection between respective ones of the plurality of word lines and respective ones of the main bit lines and at every intersection between respective ones of the plurality of the word lines and respective ones of the reference bit lines.

2. The semiconductor memory device of claim 1, wherein each of the MRAM memory cells includes a magnetic tunnel junction (MTJ) that includes a bottom electrode, a pinning layer pattern, a pinned layer pattern, a tunnel layer pattern, and a free layer pattern which are sequentially stacked.

3. The semiconductor memory device of claim 1, wherein the cladding pattern surrounding the top surfaces and sidewalls of the bit lines comprises a ferromagnetic layer.

4. The semiconductor memory device of claim 3, further comprising digit lines that cross the main bit lines and the reference bit lines.

5. The semiconductor memory device of claim 4, wherein the digit lines have bottom surfaces and sidewalls surrounded by a cladding pattern.

6. The semiconductor memory device of claim 5, wherein the cladding pattern surrounding the bottom surfaces and sidewalls of the digit lines comprises a ferromagnetic layer.

7. The semiconductor memory device of claim 6, wherein a total of one bit line from the combination of the plurality of main bit lines and the plurality of reference bit lines is interposed between the main bit line and the corresponding reference bit line of each bit line pair.

8. The semiconductor memory device of claim 1, wherein one of the main bit line or the reference bit line of each of the plurality of bit line pairs does not cross any of the main bit lines or any of the reference bit lines.

* * * * *